(12) United States Patent
Ahn et al.

(10) Patent No.: US 9,046,714 B2
(45) Date of Patent: Jun. 2, 2015

(54) THIN FILM TRANSISTOR SUBSTRATE AND METHOD FOR FABRICATING THE SAME

(75) Inventors: Han-Jin Ahn, Seoul (KR); Su-Hyun Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 161 days.

(21) Appl. No.: 12/969,053

(22) Filed: Dec. 15, 2010

(65) Prior Publication Data

US 2011/0147743 A1 Jun. 23, 2011

(30) Foreign Application Priority Data

Dec. 22, 2009 (KR) .......................... 10-2009-0129103

(51) Int. Cl.
G02F 1/1337 (2006.01)
H01L 27/12 (2006.01)

(52) U.S. Cl.
CPC ........ *G02F 1/13378* (2013.01); *H01L 27/1248* (2013.01)

(58) Field of Classification Search
CPC ............................................... G02F 1/133553
USPC ............. 257/57, 59; 264/1.31, 1.36; 438/694; 428/1.3; 349/100–150
See application file for complete search history.

(56) References Cited

U.S. PATENT DOCUMENTS 5,438,421 A * 8/1995 Sugawara et al. ............. 349/123
6,375,870 B1 * 4/2002 Visovsky et al. ............. 264/1.31
7,075,109 B2 * 7/2006 Takahara ........................ 257/59
7,230,668 B2 * 6/2007 Lee et al. ....................... 349/152
2002/0051107 A1 * 5/2002 Nagayama et al. ........... 349/113
2005/0048224 A1 * 3/2005 Araya et al. ................... 428/1.3
2005/0264732 A1 * 12/2005 Matsushima ................. 349/117
2006/0238679 A1 * 10/2006 Hirai ............................ 349/117
2006/0290856 A1    12/2006 Lim
2007/0188683 A1 * 8/2007 Naka ............................ 349/114
2008/0157414 A1 * 7/2008 Kim ............................ 264/1.36
2010/0120251 A1 * 5/2010 Sreenivasan et al. ......... 438/694

FOREIGN PATENT DOCUMENTS

CN          1794051 A      6/2006

OTHER PUBLICATIONS

Office Action issued in corresponding Chinese Patent Application No. 201010572521.6, mailed Sep. 21, 2012.
Search Report issued in corresponding Chinese Patent Application No. 201010572521.6, dated Sep. 12, 2012.

\* cited by examiner

*Primary Examiner* — Eugene Lee
*Assistant Examiner* — Fang-Xing Jiang
(74) *Attorney, Agent, or Firm* — Brinks Gilson & Lione

(57) ABSTRACT

The present invention relates to a thin film transistor substrate and a method for fabricating the same, which can shorten a process time, prevent a scratch from taking place at an alignment film, and increase black luminance. The thin film transistor substrate includes a thin film transistor formed on a substrate, a protective film formed to flatten a step of the thin film transistor and have an uneven surface with repetitive projected patterns and recessed patterns, a pixel electrode formed on the protective film to maintain an uneven shape of the protective film, and an alignment film formed both on the protective film and the pixel electrode to maintain the uneven shapes of the protective film and the pixel electrode.

9 Claims, 12 Drawing Sheets

THIN FILM TRANSISTOR SUBSTRATE AND METHOD FOR FABRICATING THE SAME

This application claims the benefit of the Korean Patent Application No. 10-2009-0129103, filed on Dec. 22, 2009, which is hereby incorporated by reference as if fully set forth herein.

BACKGROUND

1. Field of the Invention

The present disclosure relates to a thin film transistor substrate and a method for fabricating the same, which can shorten a process time, prevent scratches from taking place at an alignment film, and increase black luminance.

2. Discussion of the Related Art

In general, a liquid crystal display device controls light transmissivity by using an electric field for displaying a picture. The liquid crystal display device is provided with a thin film transistor substrate and a color filter substrate faced each other with liquid crystals placed therebetween.

The thin film transistor substrate has gate lines and data lines formed perpendicular to each other, a thin film transistor formed at every crossed portion of the gate lines and data lines, a pixel electrode connected to each of the thin film transistors, and a lower alignment film coated thereon for alignment of the liquid crystals.

The color filter substrate has color filters for producing colors, a black matrix for preventing a light from leaking, a common electrode for forming an electric filed with the pixel electrode, and an upper alignment film coated thereon.

Referring to FIG. 1, a related art alignment film 14 is formed as a rubbing roller 12 having a rubbing cloth 10 wound thereon rolls on organic polymer on a substrate 16 to rub the substrate 16.

When the alignment film 14 is brought into contact with the rubbing cloth 10 thus, foreign matters or static electricity are produced at a contact portion thereof. If such foreign matters are left on the alignment film 14, defects, like stains, take place on a screen, and the static electricity can break neighboring thin films and thin film transistors.

Moreover, alignment of the liquid crystals becomes non-uniform at a region of the alignment film 14 at which scratches are formed by the rubbing cloth 10, and a region the contact of the rubbing cloth 10 to the alignment film 14 is failed due to steps caused by a plurality of thin films under the alignment film 14. Consequently, leakage of light takes place to increase a black state luminance, making contrast of the liquid crystal display device poor.

Furthermore, in a case of a large sized panel, control of uniform rotation of the rubbing roller 12 is difficult, making obtaining uniform alignment of the liquid crystals difficult.

BRIEF SUMMARY

A thin film transistor substrate includes a thin film transistor formed on a substrate, a protective film formed to flatten a step of the thin film transistor and have an uneven surface with repetitive projected patterns and recessed patterns, a pixel electrode formed on the protective film to maintain an uneven shape of the protective film, and an alignment film formed both on the protective film and the pixel electrode to maintain the uneven shapes of the protective film and the pixel electrode.

In another aspect of the present invention, a method for fabricating a thin film transistor substrate includes the steps of forming a thin film transistor on a substrate, forming a protective film to flatten a step of the thin film transistor and have an uneven surface with repetitive projected patterns and recessed patterns, forming a pixel electrode on the protective film to maintain an uneven shape of the protective film, and forming an alignment film both on the protective film and the pixel electrode to maintain the uneven shapes of the protective film and the pixel electrode.

In another aspect of the present invention, a method for fabricating a thin film transistor substrate includes the steps of forming a thin film transistor on a substrate, forming a protective film to flatten a step of the thin film transistor, forming a pixel electrode on the protective film, and forming an alignment film to flatten a step between the projective film and the pixel electrode and have an uneven surface with repetitive projected patterns and recessed patterns.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE DRAWINGS AND THE PRESENTLY PREFERRED EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
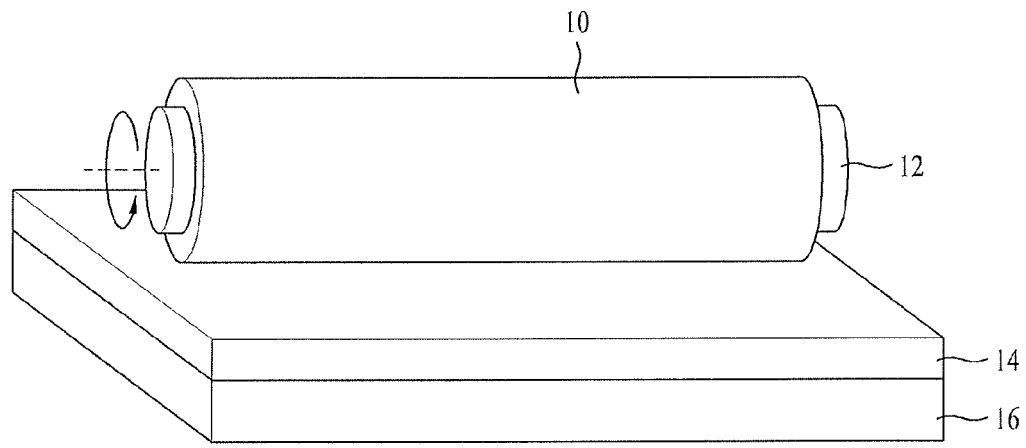
FIG. 1 illustrates a perspective view for describing a related art method for fabricating an alignment film of a liquid crystal display device.
Figure 2:
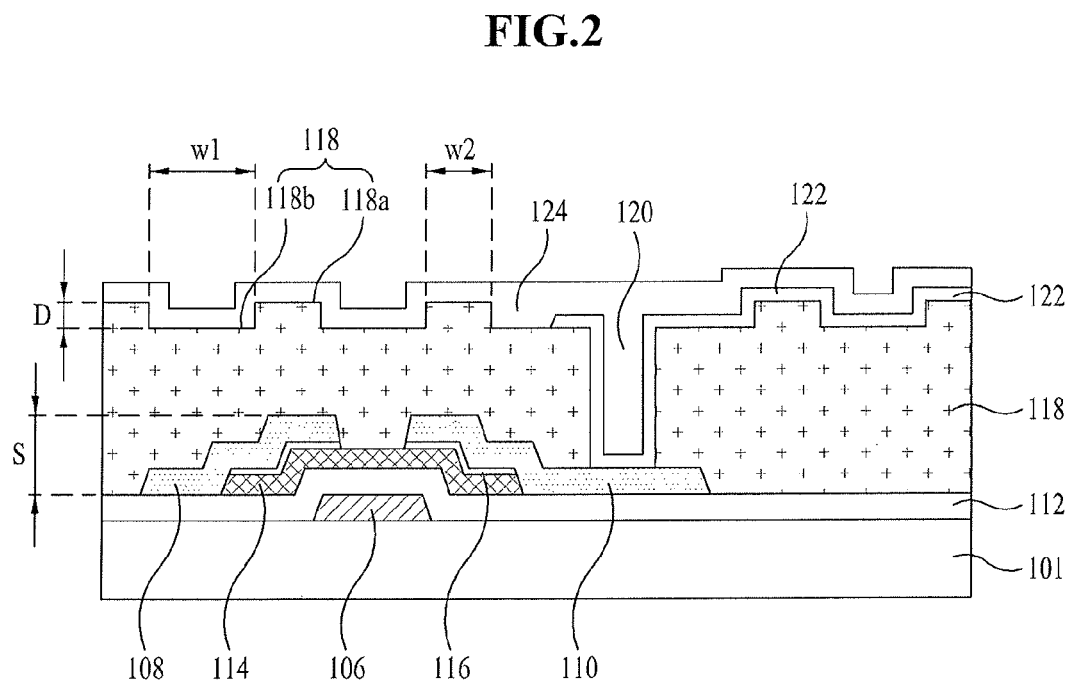
FIG. 2 illustrates a section of a thin film transistor of a liquid crystal display device in accordance with a first preferred embodiment of the present invention.

FIG. 2 illustrates a section of a thin film transistor of a liquid crystal display device in accordance with a first preferred embodiment of the present invention.

Referring to FIG. 2, the thin film transistor substrate includes a thin film transistor connected to a gate line and a data line, a protective film 118 formed to cover the thin film transistor, a pixel electrode 122 connected to the thin film transistor 130, and an alignment film 124 formed on the protective film 118 and the pixel electrode 122.

The thin film transistor supplies a data signal from the data line to the pixel electrode 122 in response to a gate signal from the gate line, selectively. For this, the thin film transistor has a gate electrode 106 connected to the gate line, a source electrode 108 connected to the data line, a drain electrode 110 connected to the pixel electrode, an active layer 114 overlapped with the gate electrode 106 with a gate insulating film 112 disposed therebetween for forming a channel between the source electrode 108 and the drain electrode 110, and an ohmic contact layer 116 for causing ohmic contact between the active layer 114 and the source and the drain electrodes 108 and 110.

The protective film 118 has an uneven surface having repetitive recessed patterns 118b and projected patterns 118a. The recessed pattern 118b of the protective film 118 has a depth D of about 50~100 nm, and a width W1 of about 200~400 nm, and the projected pattern 118a has a width W2 of about 100~200 nm. The recessed pattern 118b and the projected pattern 118a are formed in an alignment direction of the liquid crystals.

The protective film 118 is formed of an organic insulating material, such as acrylate or photo-acryl, for flattening the lower substrate 101 having the steps S of the thin film transistor. A protective film 118 of an inorganic insulating material forms a step according to the step S of the thin film transistor, causing to form a region at which a nano pattern mold to be used in patterning of the protective film 118 and the protective film fail to make a conformal contact with each other. Opposite to this, the protective film 118 of the organic insulating material of the present invention flattens the step S of the thin film transistor, allowing the nano pattern mold to be used in patterning of the protective film 118 and the protective film 118 to make a conformal contact throughout an entire region.

The pixel electrode 122 is in contact with the drain electrode 110 exposed through a pixel contact hole 120. Upon supplying a video signal to the pixel electrode 122 through the thin film transistor, the thin film transistor forms a vertical electric field with the common electrode having the common voltage being supplied thereto, causing the liquid crystal molecules arranged in a vertical direction between the thin film transistor substrate and the color filter substrate to rotate owing to dielectric anisotropy. And, an extent of rotation of the liquid crystal molecules varies light transmissivity of the light transmitting through the pixel region, to produce a gradient.

And, the pixel electrode 122 is formed on the protective film 118 at a thickness enough to maintain an uneven shape of the protective film 118 without flattening the uneven shape of the protective film 118. For an example, the pixel electrode 122 is formed to have a thickness of 50~100 nm.

The alignment film 124 is formed both on the protective film 118 and the pixel electrode 122 at a thickness enough to maintain the uneven shape of the protective film 118 without flattening the uneven shape of the protective film 118. Accordingly, the alignment film 124 having a surface uneven in conformity with the protective film 118 can align the liquid crystals without any additional liquid crystal alignment process. That is, the liquid crystals are aligned in a length direction of the recessed pattern 118b in the alignment film 124.

FIGS. 3A~3E illustrate sections showing the steps of a method for fabricating a thin film transistor substrate.

Figure 3A:
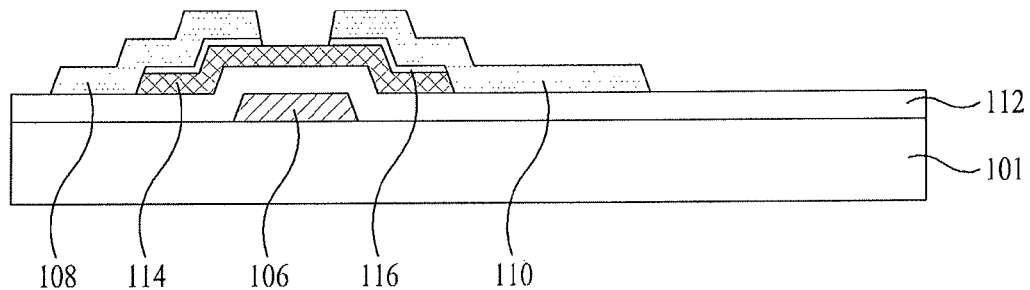
FIGS. 3A~3E illustrate sections showing the steps of a method for fabricating a thin film transistor substrate shown in FIG. 2.

Referring to FIG. 3A, a gate electrode 106, a semiconductor pattern having an active layer 114 and an ohmic contact layer 116, and a source electrode 108 and a drain electrode 110 are formed on a lower substrate 101, in succession.

In detail, a gate metal layer is formed by deposition, like sputtering, on the lower substrate 101. The gate metal layer may be single layer of metal, such as Mo, Ti, Cu, AlNd, Al, Cr, an Mo alloy, a Cu alloy, and an Al alloy, or a stack of two or more than two layers of above metal. Then, by patterning the gate metal layer with photolithography and etching, a gate electrode 106 is formed on the substrate 101.

A gate insulating film 112 of SiNx or SiOx, an amorphous silicon layer, and an impurity ($n^+$ or $p^+$) doped amorphous silicon layer are formed on the lower substrate 101 having the gate electrode 106 formed thereon in succession. Then, the amorphous silicon layer, and the impurity doped amorphous silicon layer are subjected to patterning by photolithography and etching to form a semiconductor pattern having an active layer 114 and an ohmic contact layer 116.

A data metal layer is formed on the lower substrate 101 having the semiconductor pattern formed thereon. The data metal layer may be single layer of metal, such as Mo, Ti, Cu, AlNd, Al, Cr, an Mo alloy, a Cu alloy, and an Al alloy, or a stack of two or more than two layers of above metal. Then, the data metal layer is subjected to patterning by photolithography and etching to form a source electrode 108 and a drain electrode 110. Then, the ohmic contact layer 116 is removed from between the source electrode 108 and the drain electrode 108 to expose the active layer 114.

As described before, since individual masks are required for forming the gate electrode, the semiconductor pattern, and the source and drain electrodes, three masks are required for forming above elements. Besides, in order to reduce a number of masks, the semiconductor pattern and the source and drain electrode can be formed by one time of mask process, i.e., at a time, by using a refractive mask or a semi-transparent mask.

Figure 3B:
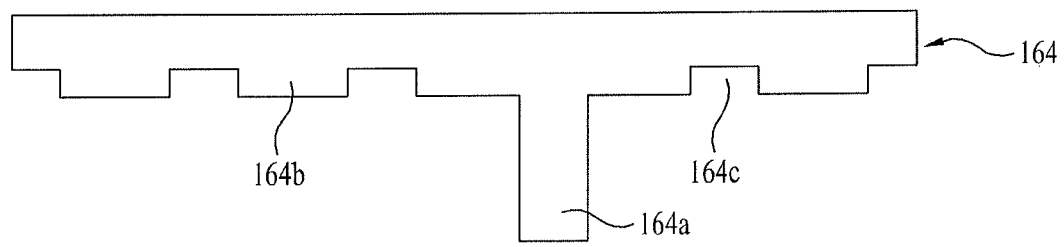
Figure 3B:
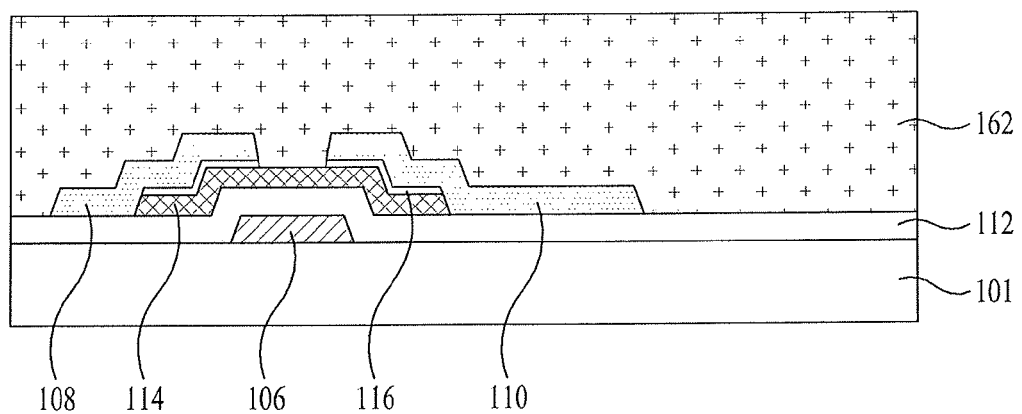

Referring to FIG. 3B, a liquid state organic insulating resin 162 is formed on the gate insulating film 112 having the source and drain electrodes 108 and 110 formed thereon by spin coating or the like. The organic insulating resin 162 has a thickness of about 1~2 μm. If the organic insulating resin 162 has a thickness below 1 μm, the organic insulating resin 162 can not flatten the step S of the thin film transistor on the lower substrate 101.

Figure 4A:
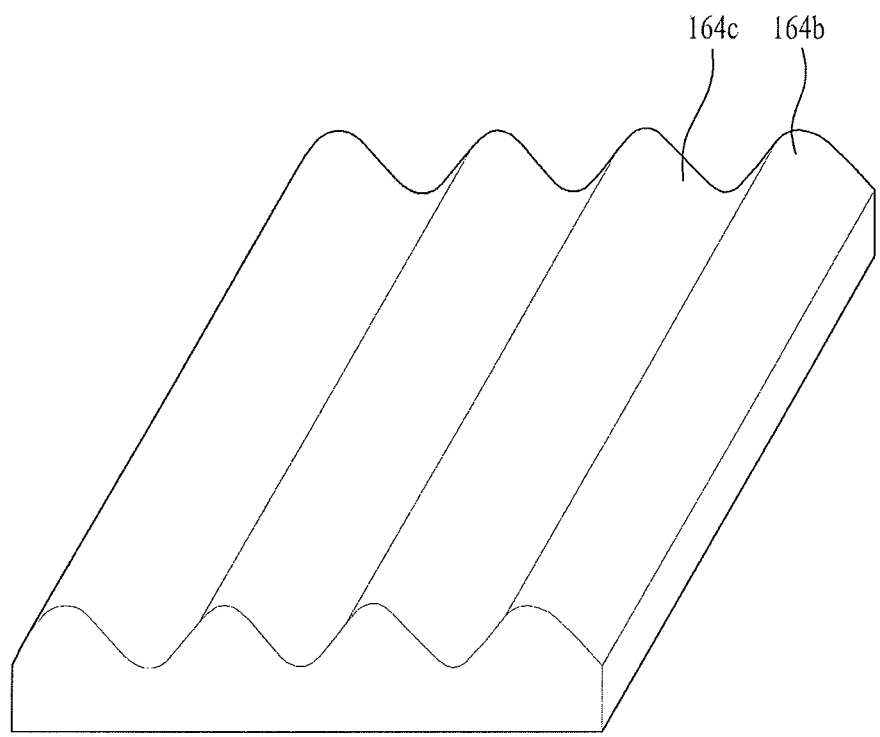
FIGS. 4A and 4B illustrate perspective views of variations of the nano pattern mold shown in FIG. 3B, respectively.
Figure 4B:
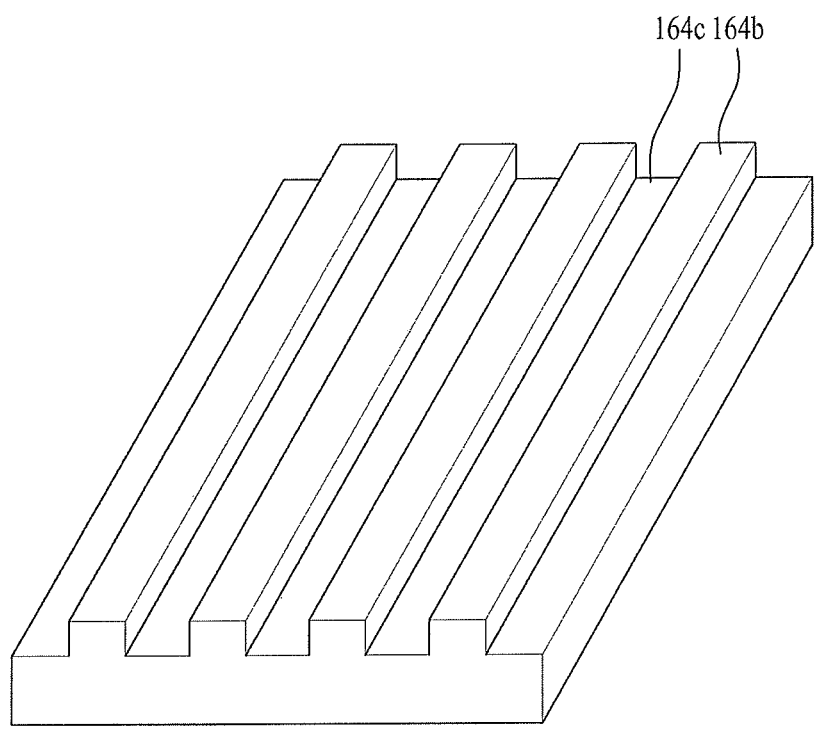

A nano pattern mold 164 is aligned on the substrate 111 having the organic insulating resin 162 formed thereon. The nano pattern mold 164 has first and second projected portions 164a and 164b and a recessed portion 164c. The first projected portion 164a of the nano pattern mold 164 matches to a region at which a pixel contact hole 120 is to be formed, the second projected portion 164b has a height higher than the first projected portion 164a, and matches to a region at which the recessed pattern 118b of the protective film 118 is to be formed, and the recessed portion 164c matches to a region at which the projected pattern 118a of the protective film 118 is to be formed. The first and second projected portions 164a and 164b and the recessed portion 164c of the nano pattern mold 164 can be formed to have a rectangular wave shape having a rectangular section as shown in FIG. 4B, or a sinusoidal wave shape having a curved section as shown in FIG. 4A.

Figure 3C:
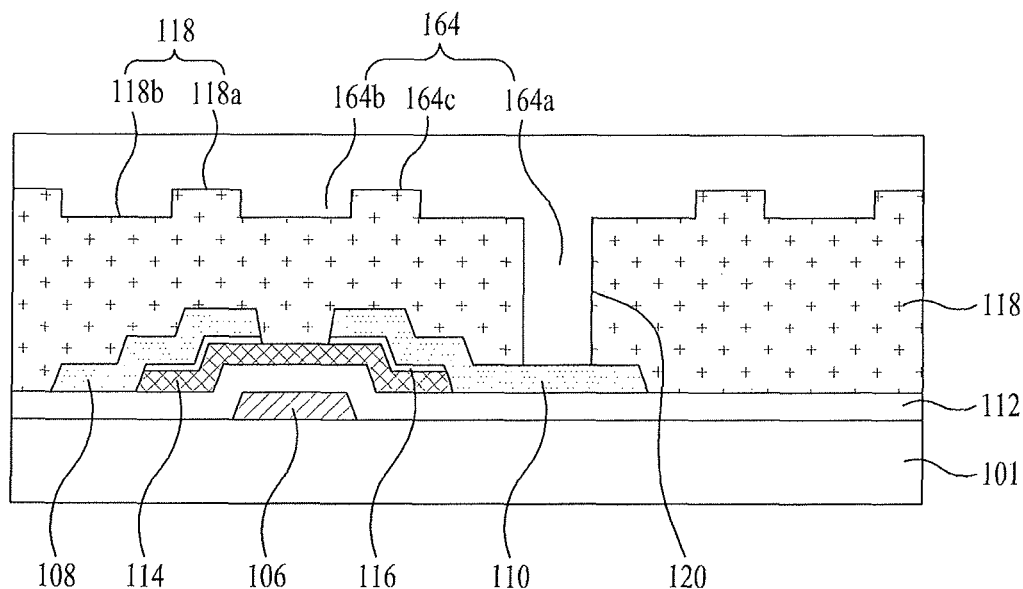

The nano pattern mold 164 is formed of polymer having a rubber characteristic, specifically, polydimethylsiloxane PDMS which can absorb a solvent of the organic insulating resin 162, effectively. As shown in FIG. 3C, the nano pattern mold 164 makes a conformal contact with the organic insulating resin 162 such that the organic insulating resin 162 moves into the recessed portion 164c in the nano pattern mold 164 by a capillary action generated by a pressure between the nano pattern mold 164 and the lower substrate 101 as the solvent is absorbed from the organic insulating resin 162 to a surface of the nano pattern mold 164. In this instance, a UV beam is directed to an entire surface of the lower substrate 101 to bake the organic insulating resin 162 to form a protective film 118 as shown in FIG. 3C. The protective film 118 has a projected pattern 118a having an inversely transcribed shape of the recessed portion 164c of the nano pattern mold 164, a recessed pattern 118b having an inversely transcribed shape of the second projected portion 164b of the nano pattern mold 164, and a pixel contact hole 120 having an inversely transcribed shape of the first projected portion 164a of the nano pattern mold 164. The recessed pattern 118b of the protective film 118 formed by the nano pattern mold 164 has a depth D of 50~100 nm, and a width W1 of 200~400 nm, and the projected pattern 118a has a width W2 of 100~200 nm. The lower substrate 101 having the protective film 118 with the projected pattern 118a, the recessed pattern 118b, and the pixel contact hole 120 formed therein thus is separated from the nano pattern mold 164.

Figure 3D:
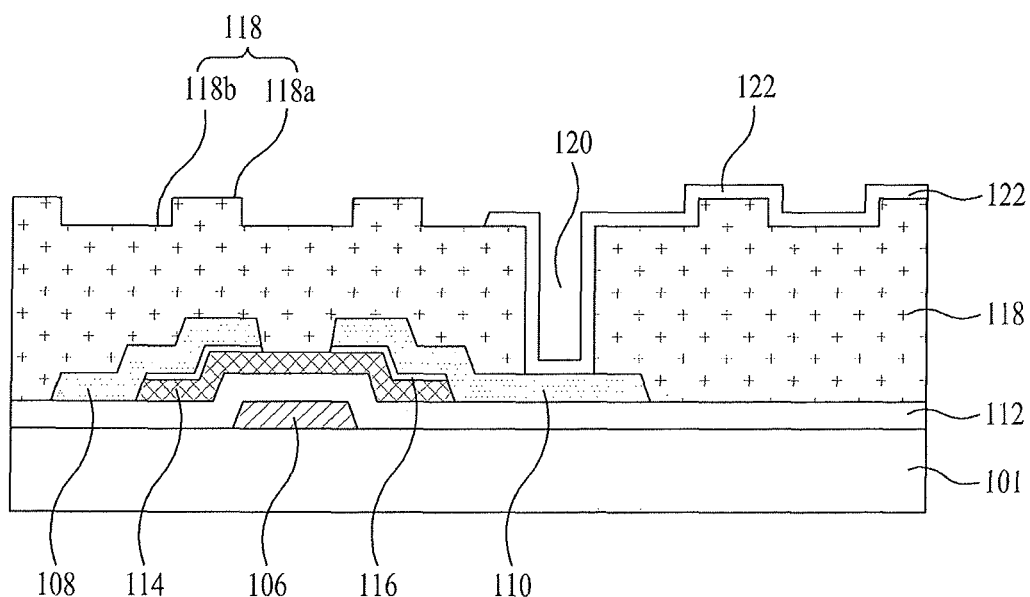

Referring to FIG. 3D, a pixel electrode 122 is formed on the lower substrate 101 having the protective film 118 formed thereon. In detail, a transparent conductive film is formed on the lower substrate 101 having the protective film 118 formed thereon by deposition, such as sputtering. The transparent conductive film is formed of ITO (Indium Tin Oxide), TO (Tin Oxide), IZO (Indium Zinc Oxide), $SnO_2$, amorphous-ITO, and so on. In this instance, the transparent conductive film is formed to a thickness of about 50~100 nm on the protective film 118 enough to maintain the projected pattern 118a and the recessed pattern 118b of the protective film 118. Then, the transparent conductive film is patterned by photolithography and etching, to form the pixel electrode 122.

Figure 3E:
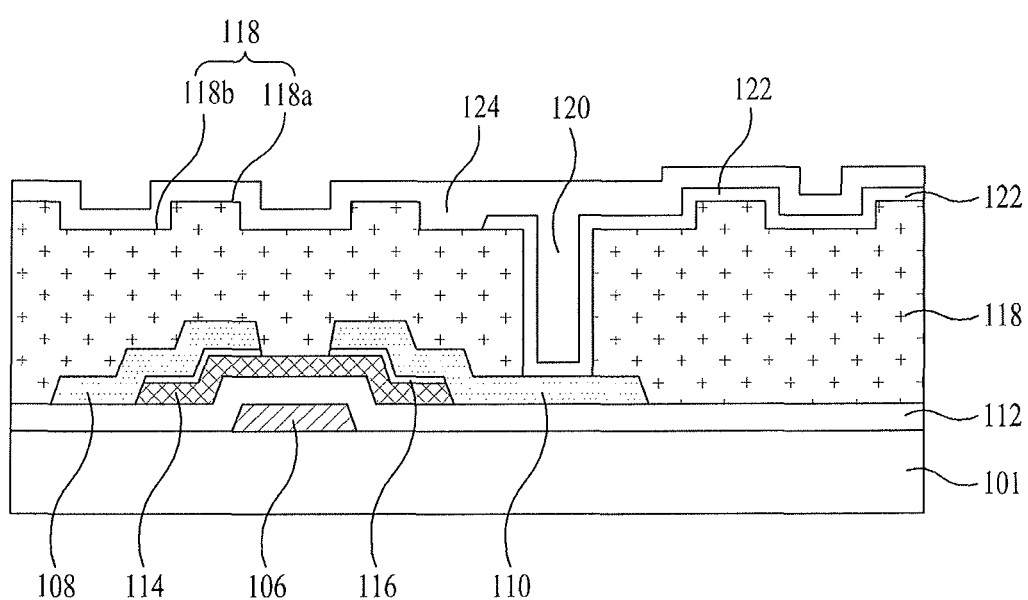

Referring to FIG. 3E, an alignment agent, such as polyimide, is coated and baked on the lower substrate 101 having the pixel electrode 122 formed thereon, to form an alignment film 124. In this instance, the alignment film 124 is formed to have a thickness of about 50~100 nm both on the protective film 118 and the pixel electrode 122 enough to maintain the projected pattern and the recessed pattern of the protective film 118 and the pixel electrode 122.

In the meantime, though the method for fabricating a thin film transistor substrate of the present invention is described taking an example in which the pixel contact hole 120 is formed at the same time with the recessed pattern 118b and the projected pattern 118a of the protective film 118 by using the nano pattern mold 164, besides this, the pixel contact hole 120 can be formed by photolithography and etching after forming the recessed pattern 118b and the projected pattern 118a of the protective film 118 by using the nano pattern mold 164.

Figure 5:
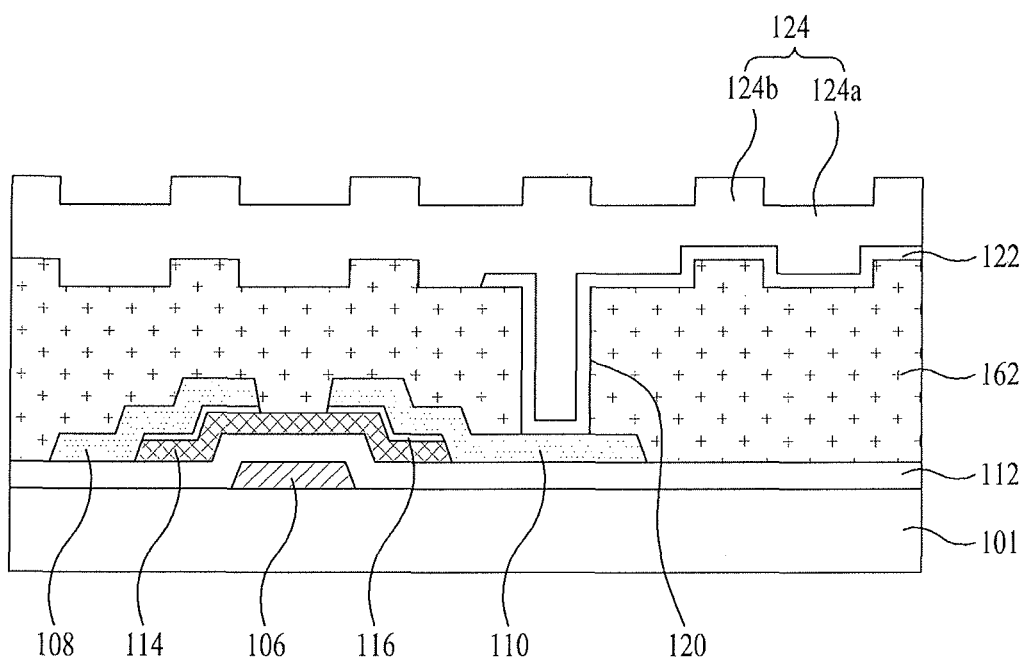
FIG. 5 illustrates a section of a thin film transistor of a liquid crystal display device in accordance with a second preferred embodiment of the present invention.

FIG. 5 illustrates a section of a thin film transistor of a liquid crystal display device in accordance with a second preferred embodiment of the present invention.

In comparison to the thin film transistor substrate shown in FIG. 2, since the thin film transistor substrate shown in FIG. 5 has elements identical thereto except flattening of the surface of the protective film 118, detailed description of the identical elements will be omitted.

In order to flatten the lower substrate having the step of the thin film transistor, the protective film 118 is formed of an organic insulating material, such as acrylate or photo-acryl. A protective film 118 of an inorganic insulating material forms a step according to the step S of the thin film transistor, causing to form a region at which a nano pattern mold to be used in patterning of the protective film 118 and the protective film fail to make a conformal contact. Opposite to this, the protective film 118 of the organic insulating material of the present invention flattens the step S of the thin film transistor, allowing the nano pattern mold to be used in patterning of the protective film 118 and the protective film to make a conformal contact throughout an entire region.

The alignment film 124 is formed to have a thickness of 1~2 μm enough to flatten the step between the pixel electrode 122 and the protective film 118. The alignment film 124 has an uneven surface with repetitive recessed patterns 124a and projected patterns 124b. Accordingly, the alignment film 124 can align the liquid crystals without any additional liquid crystal alignment process. That is, the liquid crystals on the alignment film 124 are aligned along a length direction of the recessed pattern.

FIGS. 6A~6F illustrate sections showing the steps of a method for fabricating a thin film transistor substrate in accordance with a first preferred embodiment of the present invention.

Figure 6A:
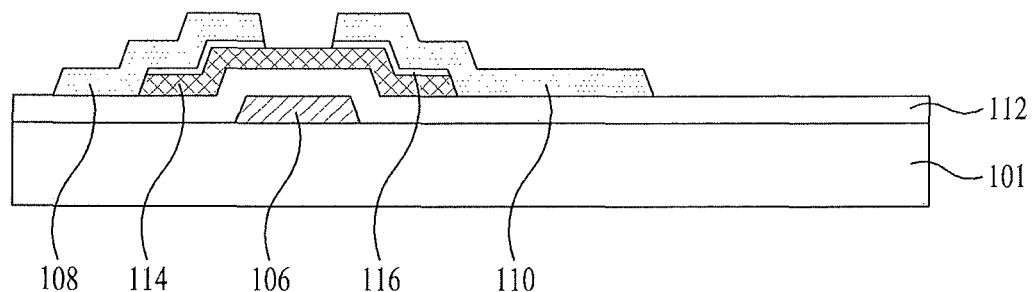
FIGS. 6A~6F illustrate sections showing the steps of a method for fabricating a thin film transistor substrate shown in FIG. 5.

Referring to FIG. 6A, a gate electrode 106, a semiconductor pattern having an active layer 114 and an ohmic contact layer 116, and a source electrode 108 and a drain electrode 110 are formed on a lower substrate 101 in succession. Since methods for forming the gate electrode, the semiconductor pattern, and the source and drain electrodes are described with reference to FIG. 3A, detailed description of which will be omitted.

Figure 6B:
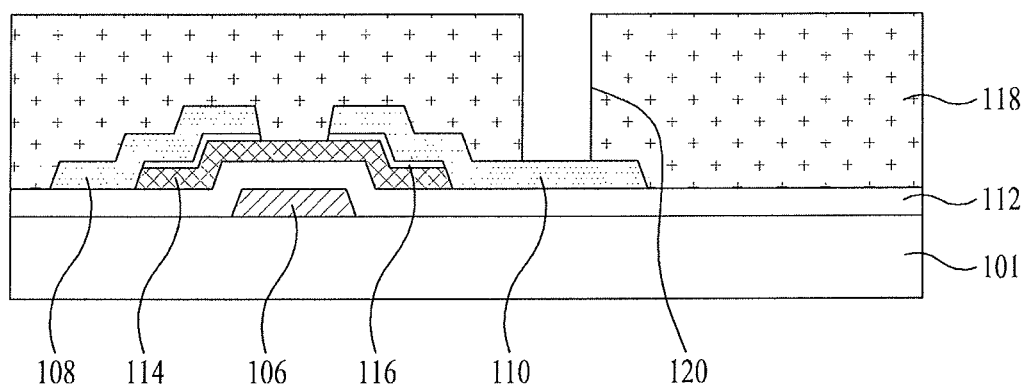

Referring to FIG. 6B, a protective film 118 having a pixel contact hole 120 is formed on a gate insulating film 112 having the source and drain electrodes 108 and 110 formed thereon. In detail, as liquid organic insulating resin is coated on the gate insulating film 112 having the source and drain electrodes 108 and 110 formed thereon by a method, such spinning, the protective film 118 is formed. The protective film 118 has a thickness of about 1~2 μm. In this instance, the protective film 118 with a thickness below 1 μm can not flatten the step of the thin film transistor on the lower substrate. The protective film 118 is patterned by photolithography and etching to form a pixel contact hole 120 which exposes the drain electrode 110.

Figure 6C:
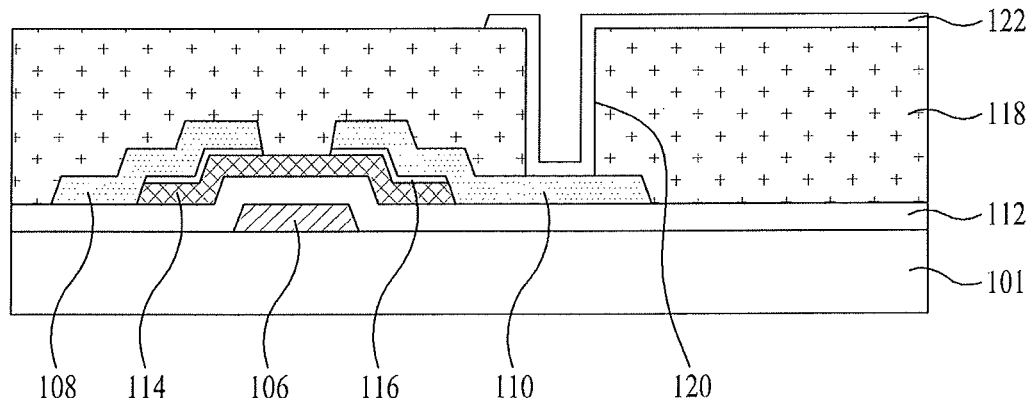

Referring to FIG. 6C, a pixel electrode 122 is formed on the lower substrate 101 having the protective film 118 formed thereon. In detail, a transparent conductive film is formed on the lower substrate 101 having the protective film 118 formed thereon by deposition, such as sputtering. The transparent conductive film is formed of ITO (Indium Tin Oxide), TO (Tin Oxide), IZO (Indium Zinc Oxide), $SnO_2$, amorphous-ITO, and so on. Then, the transparent conductive film is patterned by photolithography and etching, to form the pixel electrode 122.

Figure 6D:
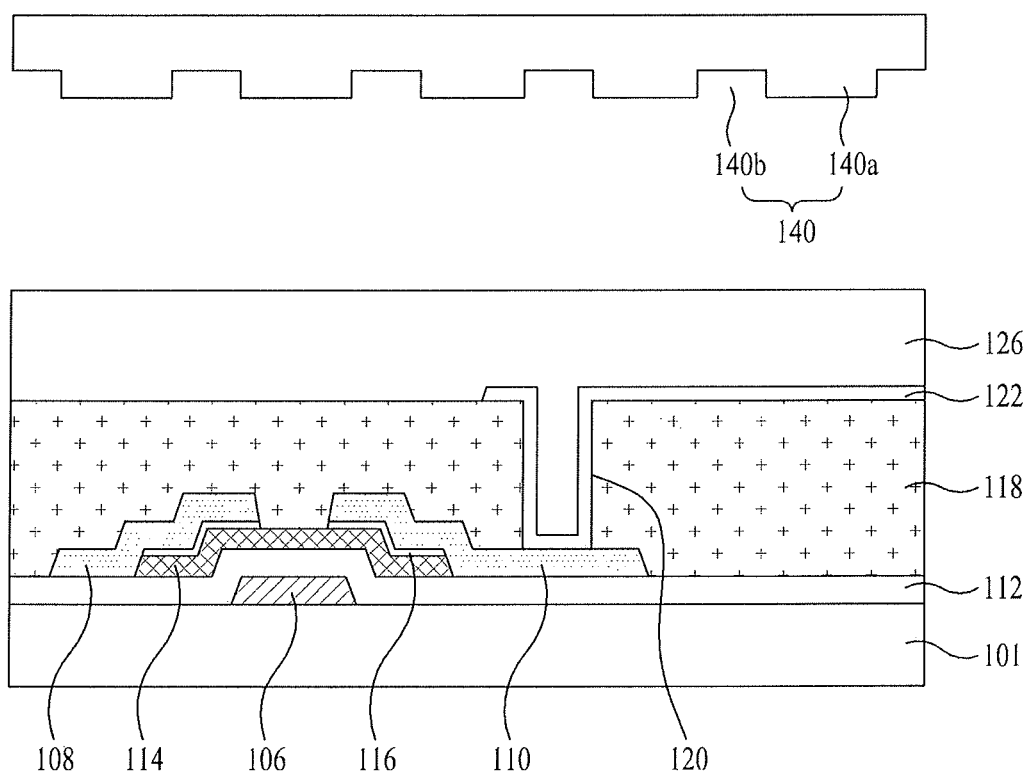

Referring to FIG. 6D, an alignment agent 126, such as polyimide, is coated on the lower substrate 101 having the pixel electrode 122 formed thereon. The alignment agent 125 is formed to have a thickness of about 1~2 μm.

A nano pattern mold 140 is aligned on the substrate 101 having the alignment agent 126 formed thereon. The nano pattern mold 140 has projected portions 140a and recessed portions 140b. The projected portions 140a of the nano pattern mold 140 match with regions of the alignment film 124 at which recessed patterns 124a of the alignment film 124 are to be formed respectively, and the recessed portions 140b of the nano pattern mold 140 match with regions of the alignment film 124 at which projected patterns 124b of the alignment film 124 are to be formed respectively. The projected portions 140a and the recessed portions 140b of the nano pattern mold 140 can be formed to have a rectangular wave shape having a rectangular section as shown in FIG. 4B, or a sinusoidal wave shape having a curved section as shown in FIG. 4A.

Figure 6E:
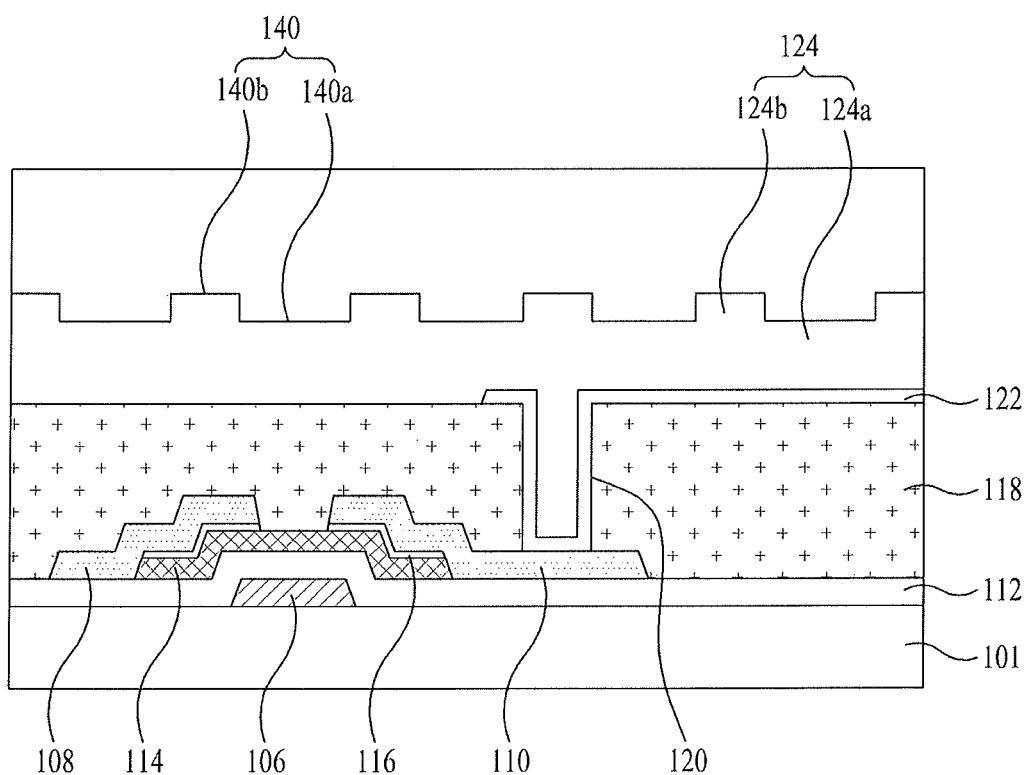
Figure 6F:
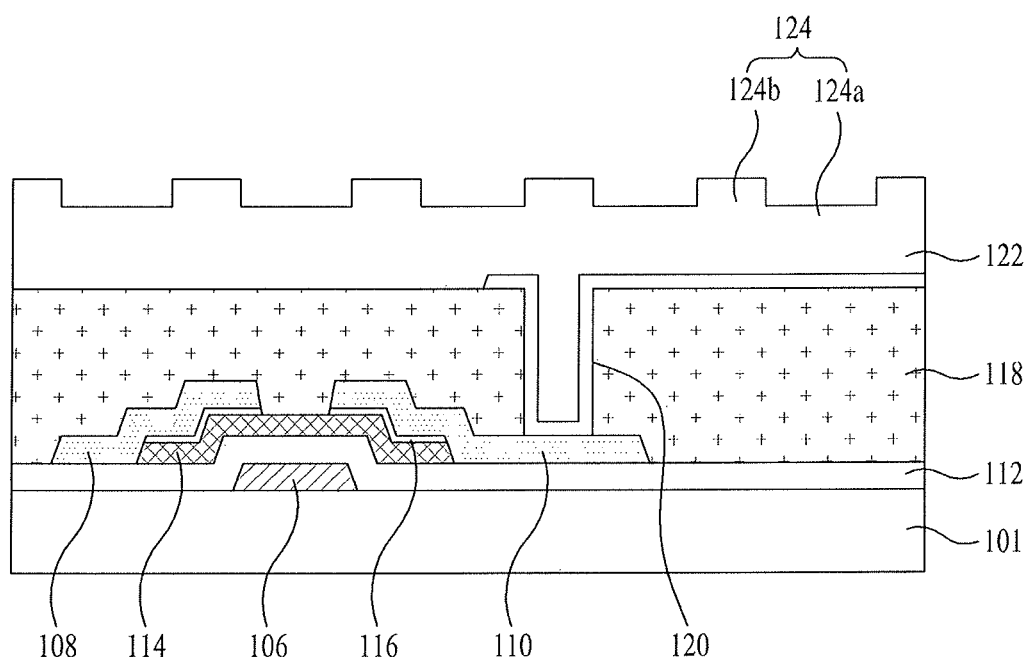

The nano pattern mold 140 is formed of polymer having a rubber characteristic, specifically, polydimethylsiloxane PDMS which can absorb a solvent of the alignment agent 126. As shown in FIG. 6E, the nano pattern mold 140 makes a conformal contact with the organic insulating resin 162 such that the alignment agent 126 moves into a recess 140b in the nano pattern mold 140 by a capillary action generated by a pressure between the nano pattern mold 140 and the lower substrate 101 as the solvent is absorbed from the alignment agent 126 to a surface of the nano pattern mold 140. In this instance, a UV beam is directed to an entire surface of the lower substrate 101 to bake the alignment agent 126 to form an alignment film 124 as shown in FIG. 6E. The alignment film 124 has projected patterns 124b having an inversely transcribed shape of the recesses 140b of the nano pattern mold 140, and recessed patterns 124a having an inversely transcribed shape of the projected portions 140a of the nano pattern mold 140. As shown in FIG. 6F, the lower substrate 101 having the alignment film 124 with the projected patterns 124a and the recessed patterns 124b formed thereon is separated from the nano pattern mold 140.

Figure 7:
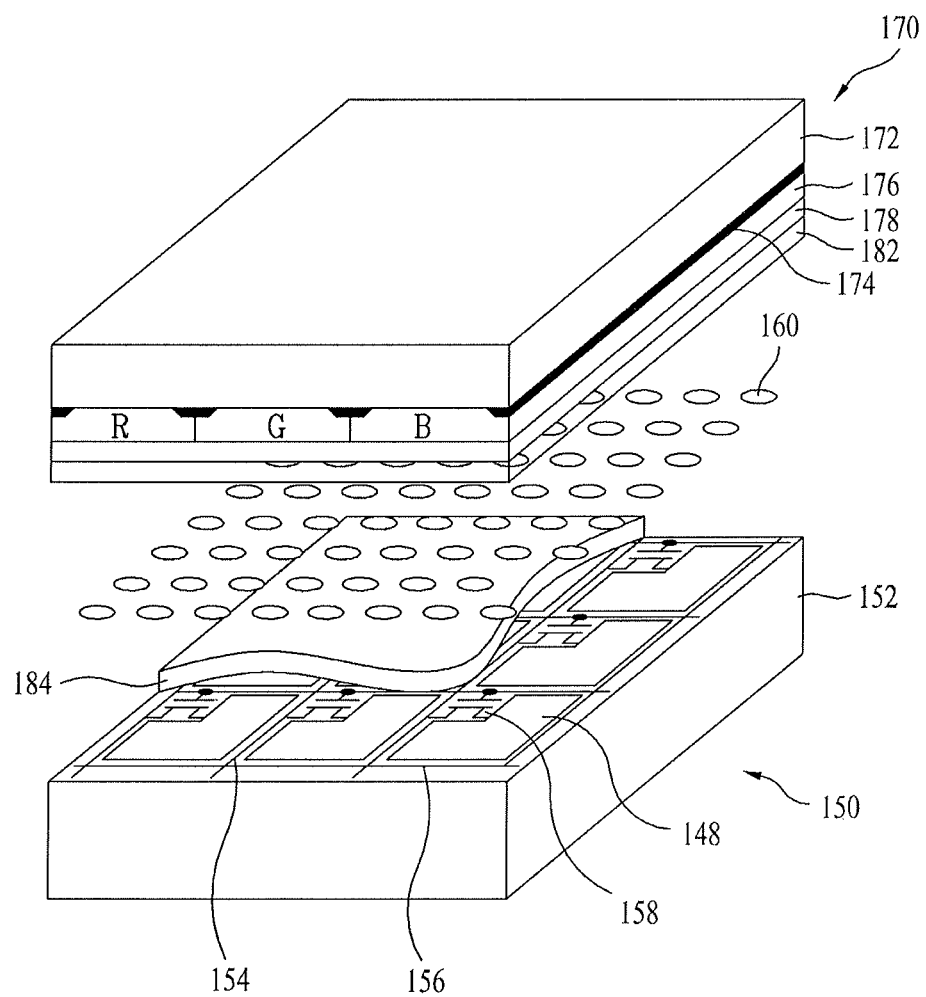
FIG. 7 illustrates a perspective view of a liquid crystal panel having a lower alignment film shown in FIG. 2 or 5.

In the meantime, the alignment film of the present invention is applied to the liquid crystal panel shown in FIG. 7. In detail, the liquid crystal panel has a thin film transistor substrate 150 and a color filter substrate 170 bonded faced to each other with a liquid crystal layer 160 disposed therebetween.

The color filter substrate 170 includes a black matrix 174 formed on an upper substrate 172 for preventing a light from leaking, a color filter 176 for producing colors, a common electrode 178 for forming an electric field with a pixel electrode, column spacers (not shown) for maintaining a cell gap, and an upper alignment film 182 covered thereon.

The thin film transistor substrate 150 includes gate lines 156 and data lines 154 formed on a lower substrate perpendicular to each other, a thin film transistor 158 adjacent to every crossed portion of the gate lines 156 and the data lines 154, a pixel electrode 148 formed on every pixel region defined by crossed structures of the gate lines 156 and data lines 154, and a lower alignment film 184 covered thereon.

The color filter 176, the black matrix 174, the column spacers (not shown), the thin film transistor 158, the gate lines 156, the data lines 154, and the pixel electrodes 148 of the liquid crystal panel can be formed by patterning with nano pattern molds having recesses in conformity with patterns of above elements, respectively.

Moreover, the alignment film 140 patterned with the nano pattern mold 120 of the present invention is applicable, not only to a TN mode type liquid crystal panel in which the pixel electrode 148 and the common electrode 178 are formed on substrates different from each other as shown in FIG. 7, but also to an IPS mode type liquid crystal panel in which the pixel electrode 148 and the common electrode 178 are formed on the same substrate. Besides, the alignment film 124 patterned with the nano pattern mold 164 or 140 of the present invention is applicable to all liquid crystal panels which require rubbing.

As has been described, the thin film transistor substrate and the method for fabricating the same of the present invention have the following advantages.

Since the alignment film is formed to have an uneven shape according to the protective film patterned with the nano pattern mold, formation of scratches on the surface of the alignment film caused by related art rubbing cloth can be prevented. Eventually, a black luminance coming from one axis alignment characteristic of liquid crystal alignment can be increased, to increase a contrast ratio. Moreover, the formation of the alignment film on the flattened protective film permits to defective alignment caused by the step of the thin film transistor, thereby preventing the light from leaking.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A method for fabricating a thin film transistor substrate comprising the steps of:
   forming a thin film transistor on a substrate;
   forming a protective film on the thin film transistor and the substrate, the protective film covering over a step of the thin film transistor and having a first flat surface and a plurality of first projections extending upwardly from the first flat surface and spaced from each other, the plurality of first projections each having a rectangular cross section;
   forming a pixel electrode on only a portion of the protective film such that the pixel electrode can maintain the same profile as a top profile of the protective film; and
   forming a non-electrically conductive alignment film having a second flat surface and a plurality of second projections extending upwardly from the second flat surface and spaced from each other in the alignment film in same step, the alignment film being formed on and in direct contact with both the protective film and the pixel electrode so that the alignment film can maintain the same profile jointly defined by the top profile of the protective film and the profile of the pixel electrode.

2. The method as claimed in claim 1, wherein the protective film is formed of an organic insulating material of an acrylate group.

3. The method as claimed in claim 2, wherein the protective film has a thickness of about 1~μm, the plurality of first projections each have a width of about 100~200 nm, and a height of about 50~100 nm, a distance between adjacent ones of the first projections is about 200~400 nm, and each of the pixel electrode and the alignment film has a thickness of about 50~100 nm.

4. The method as claimed in claim 1, wherein the step of forming a protective film includes the steps of;
   coating organic insulating resin on the substrate having the thin film transistor formed thereon,
   aligning a nano pattern mold having recessed portions and projected portions on the organic insulating resin,
   forming the protective film having the plurality of first projections by baking the organic insulating resin in a state the organic insulating resin and the nano pattern mold are in contact with each other, and
   separating the nano pattern mold from the protective film.

5. The method as claimed in claim 1, wherein the second projections and the second flat surface are alternately arranged except for a region adjacent to the pixel electrode.

6. The method as claimed in claim 1, wherein the first projections each have side surfaces parallel to each other, the side surfaces being vertical to the first flat surface.

7. The method as claimed in claim 1, wherein the second projections each have side surfaces parallel to each other and parallel to the side surfaces of the first projections.

8. The method as claim in claim 1, wherein a distance between adjacent ones of the plurality of first projections is longer than a width of each of the plurality of first projections at an area where the alignment is formed in direct contact with both the protective film and the pixel electrode.

9. The method as claimed in claim 1, wherein the second projections each have a width larger than a width of the first projections.

* * * * *